(12) United States Patent
Hong et al.

(10) Patent No.: US 9,966,531 B2
(45) Date of Patent: May 8, 2018

(54) PATTERNING METHOD FOR GRAPHENE USING HOT-EMBOSSING IMPRINTING

(71) Applicant: Graphene Square Inc., Seoul (KR)

(72) Inventors: Byung Hee Hong, Seoul (KR); Jung Hee Han, Seoul (KR)

(73) Assignee: Graphene Square, Inc., Seoul (KR)

( * ) Notice: Subject to any disclaimer, the term of this patent is extended or adjusted under 35 U.S.C. 154(b) by 653 days.

(21) Appl. No.: 14/522,095

(22) Filed: Oct. 23, 2014

(65) Prior Publication Data

US 2015/0104623 A1 Apr. 16, 2015

Related U.S. Application Data

(63) Continuation of application No. PCT/KR2013/003577, filed on Apr. 25, 2013.

(30) Foreign Application Priority Data

Apr. 25, 2012 (KR) ........................ 10-2012-0043147

(51) Int. Cl.
*H01L 51/00* (2006.01)
*B29C 59/02* (2006.01)
(Continued)

(52) U.S. Cl.
CPC ............ *H01L 51/0015* (2013.01); *B05D 3/12* (2013.01); *B29C 59/026* (2013.01);
(Continued)

(58) Field of Classification Search
CPC ... B29C 59/005; B29C 59/022; B29C 59/026; B29C 59/04; B29C 59/046; Y10T 428/24802; C01B 31/0438
See application file for complete search history.

(56) References Cited

U.S. PATENT DOCUMENTS

2008/0149900 A1* 6/2008 Jang ........................ H01B 1/122
  252/511
2011/0123776 A1* 5/2011 Shin ........................ C23C 16/26
  428/172

FOREIGN PATENT DOCUMENTS

KR  10-2002-0080780 A   10/2002
KR    10-0797007 B1     1/2008
(Continued)

OTHER PUBLICATIONS

Machine translation of KR 101228992 dated Jul. 18, 2017.*
Int'l. Search report of PCT/KR2013/003577 dated Jul. 26, 2013.

*Primary Examiner* — Gerard Higgins
(74) *Attorney, Agent, or Firm* — Greer Burns & Crain, LTD.

(57) ABSTRACT

A patterning method of a graphene, including a step of forming a graphene layer on a polymer substrate; and a step of forming a nanopattern in the graphene layer by hot embossing imprinting. The step of forming a nanopattern in the graphene layer by hot embossing imprinting includes contacting a hot mold, in which a nanopattern is formed, or contacting a roll-to-roll hot mold, in which a nanopattern is formed, to the graphene layer, followed by heating and pressing the graphene layer. In the step of forming a nanopattern in the graphene layer, the graphene layer is cleaved by a protrusion of the nanopattern formed on the hot mold or the hot roll-to-roll mold, and the cleaved graphene is present on each of a protrusion and a recessed portion of the nanopattern formed in the polymer substrate under the graphene later.

11 Claims, 4 Drawing Sheets

(51) Int. Cl.
- *B29C 59/04* (2006.01)
- *H01L 29/66* (2006.01)
- *B82Y 40/00* (2011.01)
- *H01L 29/16* (2006.01)
- *B82Y 10/00* (2011.01)
- *B05D 3/12* (2006.01)
- *B32B 37/00* (2006.01)
- *B32B 37/24* (2006.01)
- *B32B 38/06* (2006.01)

(52) U.S. Cl.
CPC .......... *B29C 59/043* (2013.01); *B32B 37/025* (2013.01); *B32B 37/24* (2013.01); *B32B 38/06* (2013.01); *B82Y 10/00* (2013.01); *B82Y 40/00* (2013.01); *H01L 29/1606* (2013.01); *H01L 29/66015* (2013.01); *H01L 51/0023* (2013.01); *B29C 2059/023* (2013.01); *B32B 2037/246* (2013.01); *H01L 51/0048* (2013.01); *Y10T 156/1041* (2015.01); *Y10T 428/24802* (2015.01)

(56) References Cited

FOREIGN PATENT DOCUMENTS

| KR | 10-2011-0054386 A | 5/2011 |
| KR | 10-1051448 B1 | 7/2011 |
| KR | 10-2011-0090397 A | 8/2011 |
| KR | 10-2012-0009323 A | 2/2012 |
| KR | 10-1228992 B1 | 2/2013 |

\* cited by examiner

PATTERNING METHOD FOR GRAPHENE USING HOT-EMBOSSING IMPRINTING

CROSS-REFERENCE TO RELATED APPLICATION

This application is a continuation of International Application No. PCT/KR2013/003577 filed on Apr. 25, 2013, claiming the priority based on Korean Patent Application No. 10-2012-0043147 filed on Apr. 25, 2012, the contents of all of which are incorporated herein by reference in their entirety.

TECHNICAL FIELD

The invention relates to a patterning method of graphene using hot embossing imprinting.

BACKGROUND

Fullerene, carbon nanotube, graphene, graphite, and the like are low-dimensional nano-materials composed of carbon atoms. That is, carbon atoms arranged in a hexagonal shape may form a ball shape to be a zero-dimensional fullerene, may be one-dimensionally rolled, to be a carbon nanotube, may form two-dimensional monolayer to be graphene, and may be three-dimensionally stacked to be graphite.

In particular, graphene has very stable and excellent electrical, mechanical, and chemical characteristics and is a very excellent conductive material in which electrons can move about 100 times faster than in silicon and current flows about 100 times more than in copper. This has been demonstrated through experiments in 2004 when a method of separating graphene from graphite was found. Since then, a great deal of research on this matter has been carried out.

Graphene is made of pure carbons which are relatively light atoms, and, thus, it is very easy to process graphene in a one-dimensional or two-dimensional nano pattern. With this feature, it is possible to control semiconductive and conductive properties and also possible to manufacture various functional devices including sensors and memories using various chemical bonds of carbon.

Despite excellent electrical, mechanical, and chemical characteristics of graphene described above, a research of an applicable technology has been limited since a mass production method of graphene has not been developed. In a conventional mass production method, graphite is mechanically ground and dispersed in a solution to form a thin film via a self-assembly phenomenon. Although graphene can be produced at a relatively low cost by the conventional method, electrical and mechanical characteristics cannot meet the expectations due to a graphene structure in which numerous graphene pieces are overlapped and connected with each other.

Due to a recent surge in demand for flat panel displays, a global transparent electrode market is expected to grow to about twenty trillion won within about 10 years. With development of a display industry in Korea, a domestic demand for transparent electrodes reaches hundreds of billions of wons every year. However, due to a lack of original technologies, Korea heavily depends on imports for transparent electrodes. An ITO (Indium Tin Oxide) as a representative transparent electrode is widely applied to a display, a touch screen, a solar cell, and the like. However, recently, a lack of indium has contributed to an increase in cost, and, thus, there has been an urgent need to develop a substitute substance. Further, due to fragility of the ITO, there has been a limit in applications of the ITO to next-generation electronic devices which is foldable, bendable, and extendable. Graphene has been expected to have excellent elasticity, flexibility, and transparency and also expected to be produced and patterned by a relatively simple method. It is anticipated that a graphene electrode has a great import substitution effect if a mass production technology thereof can be established hereafter and also has an innovative ripple effect on the whole technologies in a next-generation flexible electronic industry.

However, if a substrate including graphene thereon is manufactured by such a method, it is not easy to place the graphene at a desired position on the substrate for manufacturing a device, and if graphene is formed on a substrate for manufacturing a device, it is necessary to use a resist and to perform a lift-off process. Thus, a patterning process becomes complicated and uneconomical (see Korean Patent Laid-open Publication No. 10-2011-0054386).

DETAILED DESCRIPTION OF THE INVENTION

Problems to be Solved by the Invention

In view of the foregoing problems, one purpose of the present disclosure is to provide a patterning method of graphene using hot embossing imprinting.

However, problems to be solved by the example embodiments of the present disclosure are not limited to the above-described problems. Although not described herein, other problems to be solved by the present disclosure can be clearly understood by those skilled in the art from the following descriptions.

Means for Solving the Problems

In a first aspect of the present disclosure, there is provided a patterning method of a graphene, including a step of forming a graphene layer on a polymer substrate; and a step of forming a nanopattern on the graphene layer by hot embossing imprinting.

In a second aspect of the present disclosure, there is provided a graphene nanopattern formed by the method in accordance with the first aspect of the present disclosure.

In a third aspect of the present disclosure, there is provided a display device including the graphene nanopattern in accordance with the second aspect of the present disclosure.

Effect of the Invention

The patterning method of graphene using hot embossing imprinting in accordance with the present disclosure can easily achieve a graphene nanopattern by a simple and economical process in which it is not necessary to use a resist and to perform a lift-off process. After a patterning process of graphene, there is a difference in visibility such as transparency, reflectance, and the like between a patterned site and a non-patterned site and thus, an index-matching process is needed to make up such a difference in case of using conventional method. However, in case of using patterning method of graphene using hot embossing imprinting in accordance with the present disclosure, graphene remains on both of the patterned site and the non-patterned site. Thus, invisible patterning can be achieved and the index-matching process is not needed. Further, the patterning method of graphene using hot embossing imprinting in accordance with the present disclosure can be applied in patterning large-area graphene.

Furthermore, the patterning method of graphene using hot embossing imprinting in accordance with the present disclosure can be applied in patterning any kind of a film-shaped substrate, which can be printed by heat, as well as graphene.

The patterning method using hot embossing imprinting in accordance with the present disclosure can be used in patterning a flexible or transparent and foldable display and can also be used in a repetitive patterning process. Further, the patterning method using hot embossing imprinting in accordance with the present disclosure can be used in the field of heaters or heat radiating agents advantageous when a resistance is high (a surface area is increased) and can also be used in the field of radars including electrical or chemical sensors.

Currently, in the field of semiconductors using a silicon-based electrode, a conventional patterning method has a problem that an exothermic reaction occurs in several nanometers, which makes it difficult to achieve fine patterning. Thus, it is difficult to improve a degree of integration and performance of a semiconductor. However, graphene patterned by the patterning method using hot embossing imprinting in accordance with the present disclosure has excellent thermal and electrical conductivity and thus can be used as a next-generation semiconductor.

Therefore, the graphene nanopattern formed by the patterning method of graphene using hot embossing imprinting in accordance with the present disclosure can be used for next-generation semiconductor devices as well as various flexible devices or transparent and flexible devices.

BEST MODE FOR CARRYING OUT THE INVENTION

Figure 1A:
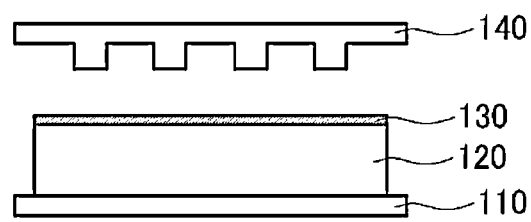
FIGS. 1A to 1D provide schematic diagrams illustrating that a patterning method of graphene is performed using a hot mold in accordance with an example embodiment of the present disclosure.
Figure 1B:
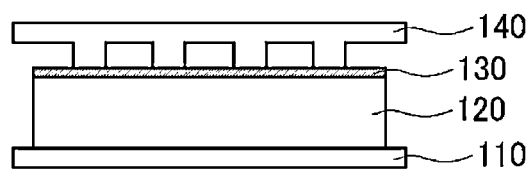
Figure 1C:
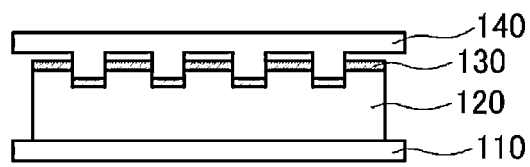
Figure 1D:
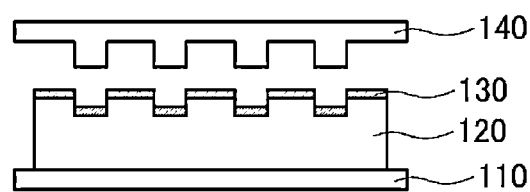

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document of the present disclosure.

Through the whole document of the present disclosure, the term "connected to" or "coupled to" that is used to designate a connection or coupling of one element to another element includes both a case that an element is "directly connected or coupled to" another element and a case that an element is "electronically connected or coupled to" another element via still another element.

Through the whole document of the present disclosure, the term "on" that is used to designate a position of one element with respect to another element includes both a case that the one element is adjacent to the another element and a case that any other element exists between these two elements.

Through the whole document of the present disclosure, the term "comprises or includes" and/or "comprising or including" used in the document means that one or more other components, steps, operation and/or existence or addition of elements are not excluded in addition to the described components, steps, operation and/or elements unless context dictates otherwise. The term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, a phrase in the form "A and/or B" means "A, B, or A and B".

Through the whole document of the present disclosure, the term "combinations of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Hereinafter, the present disclosure will be explained in detail with reference to embodiments, examples, and drawings. However, the present disclosure is not limited to the following embodiments, examples, and drawings.

In a first aspect of the present disclosure, there is provided a patterning method of a graphene, including: a step of forming a graphene layer on a polymer substrate; and a step of forming a nanopattern on the graphene layer by hot embossing imprinting.

In accordance with an example embodiment of the present disclosure, the step of forming a nanopattern on the graphene layer by hot embossing imprinting may include contacting a hot mold, in which a nanopattern is formed to the graphene layer, followed by heating and pressing the graphene layer, but may not be limited thereto. The temperature for heating and a pressure for pressing may vary depending on a kind and a size of the polymer substrate to which the graphene layer is attached. A softening temperature for a typical thermoplastic resin (polymerized resin) which can be used as the polymer substrate is in a range of from about 60° C. to about 80° C., and a softening temperature for a typical thermosetting resin (condensed resin) is in a range of from about 130° C. to about 200° C. Therefore, an appropriate heating temperature can be adequately selected depending on a kind of a polymer substrate to be used. By way of example, a heating temperature for the graphene layer may be less than about 500° C., and if the graphene layer is heated under a normal pressure at 500° C. or more, the graphene layer may be oxidized.

In accordance with an example embodiment of the present disclosure, the step of forming a nanopattern on the graphene layer may include contacting a roll-to-roll hot mold, in which a nanopattern is formed, to the graphene layer, followed by heating and pressing the graphene layer, but may not be limited thereto.

In accordance with an example embodiment of the present disclosure, the polymer substrate may be preheated before the hot embossing imprinting is performed, and a preheating temperature may vary depending on a kind and a size of the polymer substrate, but may not be limited thereto. A softening temperature for a typical thermoplastic resin (polymerized resin) which can be used as the polymer substrate is in a range of from about 60° C. to about 80° C., and a softening temperature for a typical thermosetting resin (condensed resin) is in a range of from about 130° C. to about 200° C. Therefore, an appropriate preheating temperature can be adequately selected depending on a kind of a polymer substrate to be used. By way of example, a preheating temperature for the polymer substrate may be less than about 500° C., and if the polymer substrate is heated under a normal pressure at 500° C. or more, the graphene layer may be oxidized, but may not be limited thereto.

In accordance with an example embodiment of the present disclosure, the polymer substrate may be flexible or may be transparent and flexible, but may not be limited thereto.

In accordance with an example embodiment of the present disclosure, the polymer substrate may include a member selected from the group consisting of polyarylate, polyethylene terephthalate (PET), polybutylene terephthalate (PBT), polysilane, polysiloxane, polysilazane, polyethylene (PE), polycarbosilane, polyacrylate, polymethacrylate, polymethylacrylate, poly(methylmethacrylate)(PMMA), polyethylacrylate, cyclic olefin copolymer (COC), polyethyl metacrylate, cyclic olefin polymer (COP), polypropylene (PP), polyimide (PI), polystyrene (PS), polyvinyl chloride (PVC), polyacetal (POM), polyether ether ketone (PEEK), polyester sulfone (PES), polytetrafluoroethylene (PTFE), polyvinylidene fluoride (PVDF), perfluoroalkyl polymer (PFA), and combinations thereof, but may not be limited thereto.

In accordance with an example embodiment of the present disclosure, the polymer substrate may include a thermosetting polymer, but may not be limited thereto. By way of example, the thermosetting polymer may include a member selected from the group consisting of polydimethylsiloxane (PDMS), poly(methylmethacrylate) (PMMA), polyimide (PI), polyvinylidene fluoride (PVDF), and combinations thereof, but may not be limited thereto.

In accordance with an example embodiment of the present disclosure, the polymer substrate may be formed on a hard support, but may not be limited thereto. By way of example, the hard support may include a silicon wafer, glass, quartz, or a metal, but may not be limited thereto.

In accordance with an example embodiment of the present disclosure, in the step of forming a nanopattern on the graphene layer, the graphene layer may be cleaved by a protrusion of the nanopattern formed on the hot mold contacted to the graphene layer, and the cleaved graphene may be present on each of the protrusion and a recessed portion of the nanopattern formed on the polymer substrate under the graphene layer, but may not be limited thereto.

In accordance with an example embodiment of the present disclosure, in the step of forming a nanopattern on the graphene layer, the graphene layer may be cleaved by a protrusion of the nanopattern formed on the roll-to-roll hot mold contacted to the graphene layer, and the cleaved graphene may be present on each of the protrusion and a recessed portion of the nanopattern formed on the polymer substrate under the graphene layer.

In accordance with an example embodiment of the present disclosure, the step of forming a graphene layer on a polymer substrate may include transferring a graphene sheet formed by chemical vapor deposition to the polymer substrate, but may not be limited thereto.

A method of forming the graphene may employ any method typically used in the art for graphene growth without limitation and may employ, for example, chemical vapor deposition (CVD), but may not be limited thereto. By way of example, when graphene is formed by the chemical vapor deposition, the graphene may be formed on a metal catalyst thin film, but may not be limited thereto. The metal catalyst thin film may use any material without limitation and may include a member selected from the group consisting of, for example, Ni, Co, Fe, Pt, Au, Al, Cr, Cu, Mg, Mn, Mo, Rh, Si, Ta, Ti, W, U, V, Zr, Ge, Ru, Ir, brass, bronze, white brass, stainless steel, and combinations thereof, but may not be limited thereto. The metal catalyst thin film is not particularly limited in thickness and may be a thin film or a thick film.

The chemical vapor deposition may include rapid thermal chemical vapor deposition (RTCVD), inductively coupled plasma-chemical vapor deposition (ICP-CVD), low pressure chemical vapor deposition (LPCVD), atmospheric pressure chemical vapor deposition (APCVD), metal organic chemical vapor deposition (MOCVD), and plasma-enhanced chemical vapor deposition (PECVD), but may not be limited thereto.

In an example embodiment of the present disclosure, the graphene can be grown into monolayered graphene or multilayered graphene by adding a gaseous carbon supply source to a metal catalyst thin film and performing a heat treatment thereto. In an example embodiment of the present disclosure, if a metal catalyst thin film is placed into a chamber and a heat treatment is performed at a temperature in a range of, for example, from about 300° C. to about 2000° C. while a carbon-supplying source such as carbon monoxide, ethane, ethylene, ethanol, acetylene, propane, butane, butadiene, pentane, pentene, cyclopentadiene, hexane, cyclohexane, benzene, or toluene is added thereto in the form of gas, carbon components contained in the carbon supply source are combined with each other to form a hexagonal plate structure and graphene can be formed. If the graphene is cooled, it is possible to obtain the graphene having uniform arrangement. However, the method of forming graphene on a metal catalyst thin film is not limited to the chemical vapor deposition method. In an example embodiment of the present disclosure, all the methods of forming graphene on a metal catalyst thin film can be used, and it can be understood that the present disclosure is not limited to a specific method of forming graphene on a metal catalyst thin film.

Then, the formed graphene may be separated from the metal catalyst thin film and may be transferred onto the polymer substrate.

By way of example, in the method of separating the formed graphene from the metal catalyst thin film, the graphene can be separated from the metal catalyst thin film by immersing the metal catalyst thin film on which the graphene is formed in an etching solution.

The etching solution may include etchants capable of removing the metal catalyst thin film for the graphene growth, but may not be limited thereto. The etchants may include, for example, KOH (Potassium Hydroxide), TMAH (Tetra Methyl Ammonium Hydroxide), EDP (Ethylene Diamine Pyrocatechol), BOE (Burrered Oxide Etchant), FeCl$_3$, Fe(NO$_3$)$_3$, HF, H$_2$SO$_4$, HPO$_4$, HCl, NaF, KF, NH$_4$F, AlF$_3$, NaHF$_2$, KHF$_2$, NH$_4$HF$_2$, HBF$_4$, or NH$_4$BF$_4$, but may not be limited thereto.

A graphene nanopattern formed by the method in accordance with the present disclosure can be applied to various devices, and may be used as, for example, a transparent electrode included in various display devices. The graphene electrode exhibits excellent electrical characteristics, i.e. high conductivity, low contact resistance, and the like, and the graphene electrode is very thin and flexible, and, thus, it is possible to manufacture a flexible and transparent electrode.

In a second aspect of the present disclosure, there is provided a graphene nanopattern formed by the method in accordance with the first aspect of the present disclosure.

In a third aspect of the present disclosure, there is provided a display device including the graphene nanopattern in accordance with the second aspect of the present disclosure.

Hereinafter, embodiments and examples of the patterning method of graphene in accordance with the present disclosure will be explained in detail with reference to drawings. However, the present disclosure is not limited to the following examples and drawings.

FIGS. 1A to 1D schematically illustrate a patterning method of graphene using a hot mold in accordance with an example embodiment of the present disclosure. A hot mold 140 in which a nanopattern is formed is brought into contact with a graphene layer 130 formed on a polymer substrate 120 on a hard support 110, and then, the graphene layer 130 is heated and pressed to form a nanopattern thereon.

Figure 2:
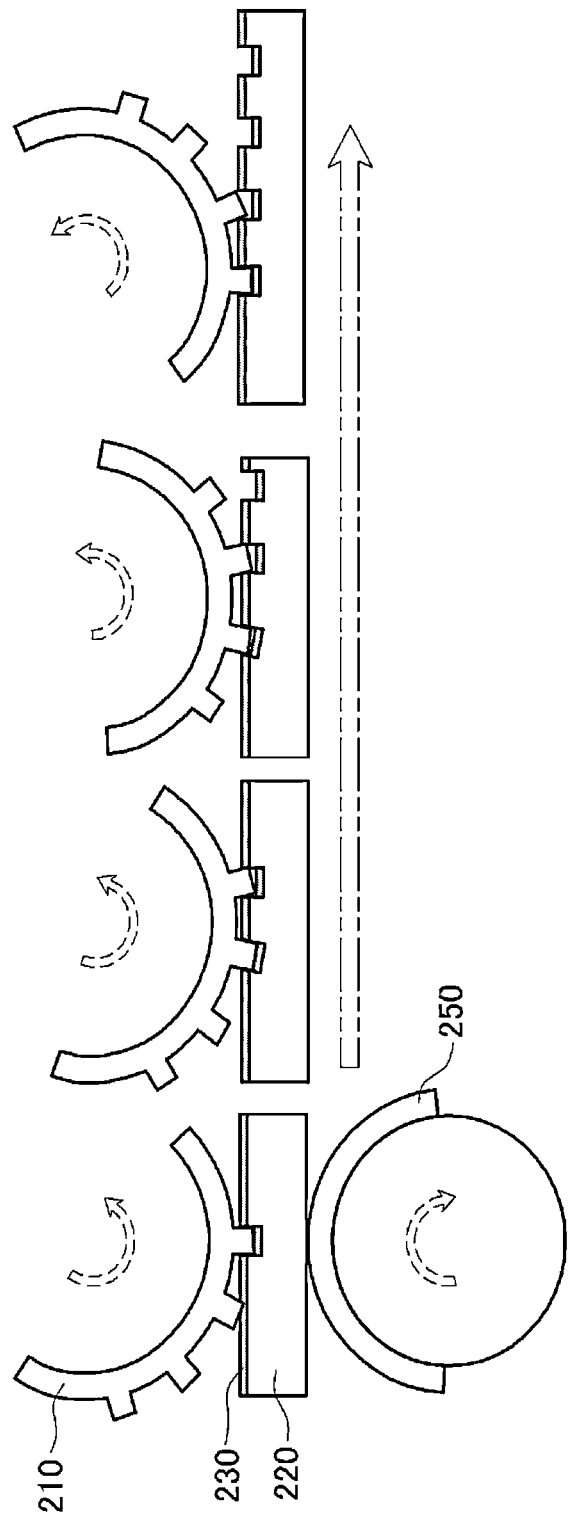
FIG. 2 is a schematic diagram illustrating that a patterning method of graphene is performed using a roll-to-roll hot mold in accordance with an example embodiment of the present disclosure.

FIG. 2 schematically illustrates a patterning method of graphene using a roll-to-roll hot mold in accordance with an example embodiment of the present disclosure. A roll-to-roll hot mold 210 in which a nanopattern is formed is brought into contact with a graphene layer 230 formed on a polymer substrate 220, and then, the graphene layer 230 is heated and pressed to form a nanopattern thereon by a roll-to-roll process.

Figure 3:
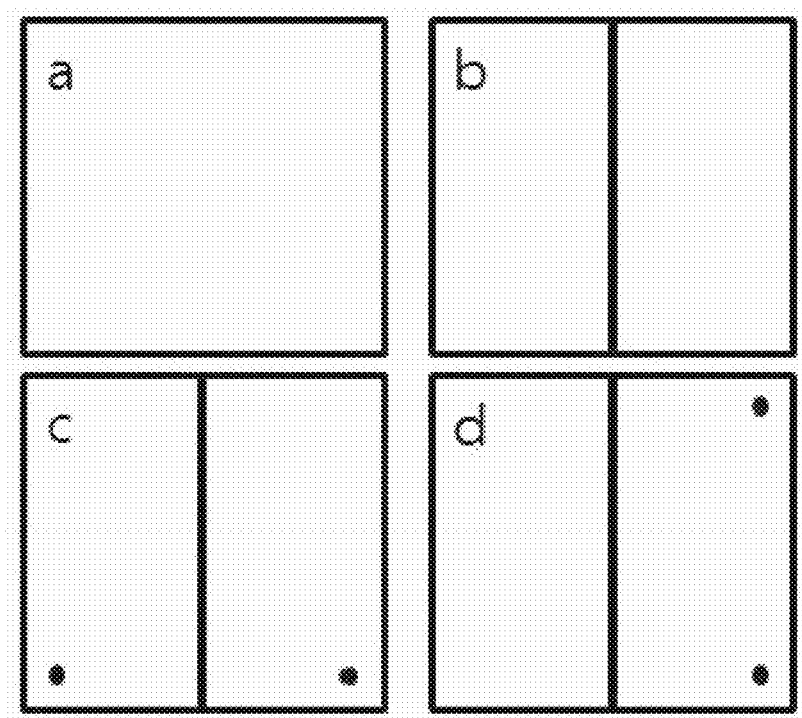
FIG. 3 provides schematic diagrams of graphene patterned in accordance with an example embodiment of the present disclosure.

In an example embodiment, the graphene has a very small thickness. Therefore, if patterns traversing the graphene are formed on the graphene, a stepped portion is formed between the patterns, which may cause an electrical short circuit. FIG. 3 provides schematic diagrams showing whether or not an electrical short circuit is formed in graphene patterned in accordance with an example embodiment of the present disclosure. a in FIG. 3 shows graphene on which a pattern is not formed, b in FIG. 3 shows graphene on which a linear pattern traversing the graphene is formed, and c in FIG. 3 and d in FIG. 3 schematically show cases where a resistance of the graphene on which a linear pattern traversing the graphene is formed is measured using a multimeter (marked by a dot). If resistances are measured with a pattern between graphene as shown in c in FIG. 3, the graphene on both sides are short circuited and the resistances are measured as "0". If resistances are measured along a direction of the pattern as shown in d in FIG. 3, the resistances having certain values other than 0 are measured.

Further, since the graphene is present on the pattern of graphene, a phenomenon in which a pattern formed on a transparent electrode is visible may not occur even without adding a process such as index-matching. It is possible to manufacture a high-quality transparent electrode having various patterns and applications using such a phenomenon, but may not be limited thereto.

In an example embodiment, a temperature for heating and a pressure for pressing may vary depending on kinds and sizes of the polymer substrates 120 and 220 to which the graphene layers 130 and 230 is attached. A softening temperature for a typical thermoplastic resin (polymerized resin) which can be used as the polymer substrates 120 and 220 is in a range of from about 60° C. to about 80° C., and a softening temperature for a typical thermosetting resin (condensed resin) is in a range of from about 130° C. to about 200° C. Therefore, an appropriate heating temperature can be adequately selected depending on kinds of the polymer substrates 120 and 220. By way of example, a heating temperature for the graphene layers 130 and 230 may be less than about 500° C., and if the graphene layers 130 and 230 are heated under a normal pressure at 500° C. or more, the graphene layers 130 and 230 may be oxidized.

In an example embodiment, the polymer substrates 120 and 220 may be preheated before the hot embossing imprinting is performed, and a preheating temperature may vary depending on kinds and sizes of the polymer substrates 120 and 220, but may not be limited thereto. A softening temperature for a typical thermoplastic resin (polymerized resin) which can be used as the polymer substrates 120 and 220 is in a range of from about 60° C. to about 80° C., and a softening temperature for a typical thermosetting resin (condensed resin) is in a range of from about 130° C. to about 200° C. Therefore, an appropriate preheating temperature can be adequately selected depending on kinds of the polymer substrates 120 and 220. By way of example, a preheating temperature for the polymer substrates 120 and 220 may be less than about 500° C., and if the polymer substrates 120 and 220 are heated under a normal pressure at 500° C. or more, the graphene layers 130 and 230 may be oxidized, but may not be limited thereto.

In accordance with an example embodiment, the polymer substrates 120 and 220 may be flexible or may be transparent and flexible, but may not be limited thereto. The polymer substrates 120 and 220 may include a thermosetting polymer, but may not be limited thereto. By way of example, the thermosetting polymer may include a member selected from the group consisting of Polydimethylsiloxane (PDMS), Poly (methylmethacrylate) (PMMA), Polyimide (PI), Polyvinylidene fluoride (PVDF), and combinations thereof, but may not be limited thereto.

In accordance with an example embodiment, the polymer substrates 120 and 220 may be formed on a hard support 110, but may not be limited thereto. By way of example, the hard support 110 may include a silicon wafer, glass, quartz, or a metal, but may not be limited thereto.

In accordance with an example embodiment, in the step of forming a nanopattern on the graphene layers 130 and 230, the graphene layers 130 and 230 may be cleaved by a protrusion of the nanopattern formed on the hot mold 140 or the roll-to-roll hot mold 210 contacted to the graphene layers 130 and 230, and the cleaved graphene may be present on each of the protrusion and a recessed portion of the nanopattern formed on the polymer substrates 120 and 220 under the graphene layers 130 and 230, but may not be limited thereto.

EXAMPLE

Figure 4:
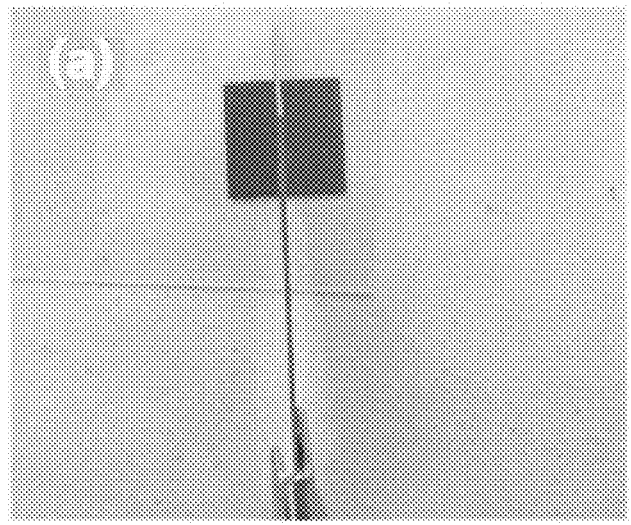
FIG. 4 provides photos showing a patterning method of graphene in accordance with an example of the present disclosure.
Figure 4:
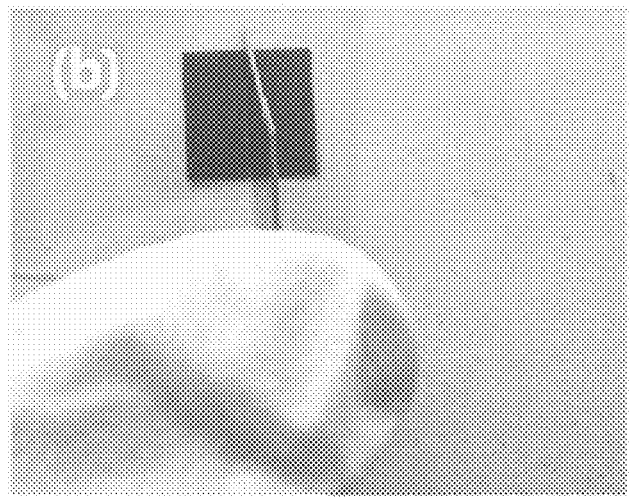
Figure 4:
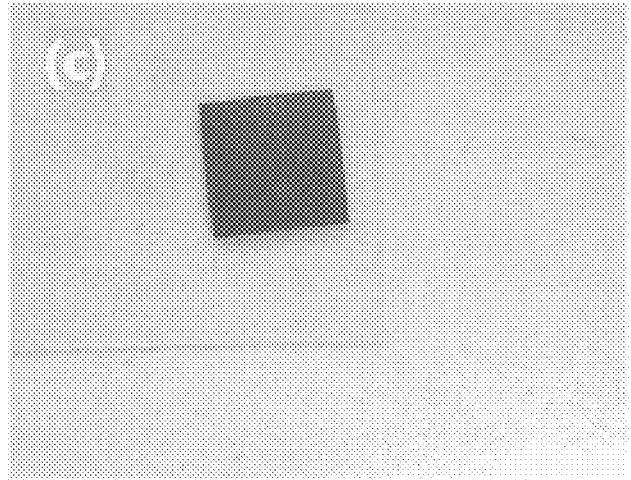

FIG. 4 is an example showing a patterning process of graphene using hot embossing imprinting in accordance with the present disclosure. FIG. 4 shows that (a) a hot mold is positioned on a graphene, (b) a pressure is applied to the hot mold, and (c) a pattern is formed on the graphene accordingly.

After a pattern is formed on graphene by hot embossing imprinting in accordance with the above example, resistances of the graphene and non-patterned graphene were measured to check whether when a pattern traversing graphene is formed on the graphene, a stepped portion is formed on the graphene, resulting in an electrical short circuit. When a resistance of the non-patterned graphene was measured, a normal resistance value (209.8Ω) was measured. However, when a resistance was measured from the graphene, on which the pattern traversing the graphene was formed, with the pattern between them, a stepped portion was formed and current did not flow between two contact points, and, thus, a resistance is measured as 0Ω. Meanwhile, if a resistance is measured along a direction of the pattern from the graphene on which the pattern traversing the graphene without the pattern therebetween, a resistance was measured as 124.7Ω. Thus, it could be seen that if a pattern traversing graphene is formed on the graphene, an electrical short circuit is formed.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

EXPLANATION OF REFERENCE NUMERALS

110: Hard support
120, 220: Polymer substrates
130, 230: Graphene layer
140: Hot mold
210: Roll-to-roll hot mold
250: Roll

We claim:

1. A patterning method of a graphene, comprising:
a step of forming a graphene layer on a polymer substrate; and
a step of forming a nanopattern in the graphene layer by hot embossing imprinting, wherein the step of forming a nanopattern in the graphene layer by hot embossing imprinting includes contacting a hot mold, in which a nanopattern is formed, or contacting a roll-to-roll hot mold, in which a nanopattern is formed, to the graphene layer, followed by heating and pressing the graphene layer,
wherein, in the step of forming a nanopattern in the graphene layer, the graphene layer is cleaved by a protrusion of the nanopattern formed on the hot mold or the roll-to-roll hot mold, and the cleaved graphene is present on each of a protrusion and a recessed portion of the nanopattern formed in the polymer substrate under the graphene later.

2. The patterning method of claim 1,
wherein the step of forming a nanopattern in the graphene layer by hot embossing imprinting includes contacting the hot mold, in which a nanopattern is formed, to the graphene layer followed by heating and pressing the graphene layer.

3. The patterning method of claim 1,
wherein the step of forming a nanopattern in the graphene layer includes contacting the roll-to-roll hot mold, in which a nanopattern is formed, to the graphene layer followed by heating and pressing the graphene layer.

4. The patterning method of claim 1,
wherein the polymer substrate includes a member selected from the group consisting of polyarylate, polyethylene terephthalate, polybutylene terephthalate, polysilane, polysiloxane, polysilazane, polyethylene, polycarbosilane, polyacrylate, polymethacrylate, polymethylacrylate, poly(methylmethacrylate), polyethylacrylate, cyclic olefin copolymer, poly(ethyl methacrylate), cyclic olefin polymer, polypropylene, polyimide, polystyrene, polyvinylchloride, polyacetal, polyether ether ketone, polyester sulfone, polytetrafluoroethylene, polyvinylidene fluoride, perfluoroalkyl polymer, and combinations thereof.

5. The patterning method of claim 1,
wherein the polymer substrate includes a thermosetting polymer.

6. The patterning method of claim 5,
wherein the thermosetting polymer includes a member selected from the group consisting of polydimethylsiloxane, polyimide, and combinations thereof.

7. The patterning method of claim 1,
wherein the polymer substrate is formed on a support member.

8. The patterning method of claim 7,
wherein the support member includes a silicon wafer, glass, quartz, or a metal.

9. The patterning method of claim 1,
wherein the step of forming a graphene layer on the polymer substrate includes transferring a graphene sheet formed by chemical vapor deposition to the polymer substrate.

10. A patterning method of a graphene, comprising:
a step of forming a graphene layer on a polymer substrate; and
a step of forming a nanopattern in the graphene layer by hot embossing imprinting,
wherein the step of forming a nanopattern in the graphene layer by hot embossing imprinting includes contacting a hot mold, in which a nanopattern is formed, to the graphene layer followed by heating and pressing the graphene layer,
wherein, in the step of forming a nanopattern in the graphene layer, the graphene layer is cleaved by a protrusion of the nanopattern formed on the hot mold contacted to the graphene layer, and the cleaved graphene is present on each of the protrusion and a recessed portion of the nanopattern formed in the polymer substrate under the graphene layer.

11. A patterning method of a graphene, comprising:
a step of forming a graphene layer on a polymer substrate; and
a step of forming a nanopattern in the graphene layer by hot embossing imprinting,
wherein the step of forming a nanopattern in the graphene layer includes contacting a roll-to-roll hot mold, in which a nanopattern is formed, to the graphene layer followed by heating and pressing the graphene layer,
wherein, in the step of forming a nanopattern in the graphene layer, the graphene layer is cleaved by a protrusion of the nanopattern formed on the roll-to-roll hot mold contacted to the graphene layer, and the cleaved graphene is present on each of the protrusion and a recessed portion of the nanopattern formed in the polymer substrate under the graphene layer.

* * * * *